United States Patent
Choe

(10) Patent No.: US 6,927,600 B2
(45) Date of Patent: Aug. 9, 2005

(54) RESISTANCE CALIBRATION CIRCUIT IN SEMICONDUCTOR DEVICE

(75) Inventor: Seong-Min Choe, Ichon-shi (KR)

(73) Assignee: Hynix Semiconductor Inc. (KR)

(*) Notice: Subject to any disclaimer, the term of this patent is extended or adjusted under 35 U.S.C. 154(b) by 0 days.

(21) Appl. No.: 10/625,127

(22) Filed: Jul. 22, 2003

(65) Prior Publication Data

US 2004/0124902 A1 Jul. 1, 2004

(30) Foreign Application Priority Data

Sep. 2, 2002 (KR) ............................... 10-2002-0052564

(51) Int. Cl.[7] .............................................. H03K 17/16
(52) U.S. Cl. .............................. 326/30; 326/32; 326/34
(58) Field of Search ................................ 326/30–34, 87

(56) References Cited

U.S. PATENT DOCUMENTS

| 5,331,501 | A | | 7/1994 | Shimp |
| 6,329,139 | B1 | | 12/2001 | Nova et al. |
| 6,466,487 | B1 | * | 10/2002 | Otsuka ................... 365/189.05 |
| 6,509,778 | B2 | * | 1/2003 | Braceras et al. ............ 327/308 |
| 2002/0163355 | A1 | | 11/2002 | van Bavel et al. |

FOREIGN PATENT DOCUMENTS

| JP | 02-040567 | 2/1990 |
| JP | 04-015932 | 1/1992 |
| JP | 05-029937 | 2/1993 |
| JP | 07-169277 | 7/1995 |
| KR | 2002-12407 | 12/2004 |

* cited by examiner

*Primary Examiner*—Anh Q. Tran
(74) *Attorney, Agent, or Firm*—Blakely Sokoloff Taylor & Zafman

(57) ABSTRACT

The present invention relates to a resistance calibration circuit to correct a resistance variation in an output terminal of a semiconductor device. The resistance calibration circuit according to the present invention includes: a correction code generator for generating a plurality of push-up code signals and a plurality of pull-down code signals based on an external reference resistor, wherein a reference voltage is applied to the correction code generator; a push-up decoder for decoding the plurality of push-up code signals from the correction code generator; a pull-down decoder for decoding the plurality of pull-down code signals from the correction code generator; and a resistance adjustor for receiving a push-up signal from the push-up decoder and a pull-down signal from the pull-down decoder and for turning on/off a plurality of inner transistors.

7 Claims, 5 Drawing Sheets

RESISTANCE CALIBRATION CIRCUIT IN SEMICONDUCTOR DEVICE

FIELD OF THE INVENTION

The present invention relates to a semiconductor device, and more particularly, to a resistance calibration circuit to correct a resistance variation in an output terminal of a semiconductor device or each stage in the device, which is caused by a voltage variation, a temperature and manufacturing process, and to keep the resistance constant.

DESCRIPTION OF THE PRIOR ART

Generally, when a transistor is implemented in a terminal of the semiconductor chip, the resistance (hereinafter, referred to as a "termination resistance") can vary due to the manufacturing processes, the voltage variation or a temperature and this variation of resistance, which is different from the desired value, can deteriorate the reliability of the semiconductor device.

In order to solve this variation of resistance, a conventional semiconductor device has been designed to minimize an effect on the termination resistance. That is, the termination resistance of the conventional semiconductor device has been designed to have a minimized effect, being compared with the entire resistance of the transistors implemented therein, so that the weight of the termination resistance has been lower than that of the entire resistance.

However, in the conventional semiconductor, since low resistance of the transistor is required in the output terminal, a size of the transistor is increased. Accordingly, the transistor in the output terminal needs a relatively large chip area with a low resistance and this makes a processing cost high. Also, since there is no design method to cope with the resistance variation of the transistor, this resistance variation has been a specific problem of device deterioration, especially in the high performance chip.

SUMMARY OF THE INVENTION

An object of the present invention is to provide a resistance calibration circuit to correct a resistance distortion, which is caused by a transistor or a contact in an output terminal of a semiconductor device, by using a plurality of transistors and calibrating a termination resistance to have the same external resistance.

In accordance with an aspect of the present invention, there is provided a resistance calibration circuit in a semiconductor device, wherein the resistance calibration circuit is coupled to an I/O terminal of the semiconductor device, the resistance calibration circuit comprising; a first resistor connected to the I/O terminal; a second resistor connected to the I/O terminal; a plurality of push-up transistors connected to the first resistor and controlled by a push-up signal, wherein the push-up transistors are in parallel connected to each other; a plurality of pull-down transistors connected to the second resistor and controlled by a pull-down signal, wherein the pull-down transistors are in parallel connected to each other; and a control signal generator for producing the push-up signal and the pull-down signal based on a voltage variation of a voltage difference between a reference voltage and an external voltage, wherein the external voltage is applied to a fixed resistor.

In the present invention, the resistance calibration circuit in a semiconductor device includes: a correction code generating means for generating a plurality of push-up code signals and a plurality of pull-down code signals based on an external reference resistor, wherein a reference voltage is applied to the correction code generating means; a push-up decoder for decoding the plurality of push-up code signals from the correction code generating means; a pull-down decoder for decoding the plurality of pull-down code signals from the correction code generating means; and a resistance adjustor for receiving a push-up signal from the push-up decoder and a pull-down signal from the pull-down decoder and for turning on/off a plurality of inner transistors.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE PREFERRED EMBODIMENTS

Hereinafter, a resistance calibration circuit according to one embodiment of the present invention will be described in detail below.

Figure 1:
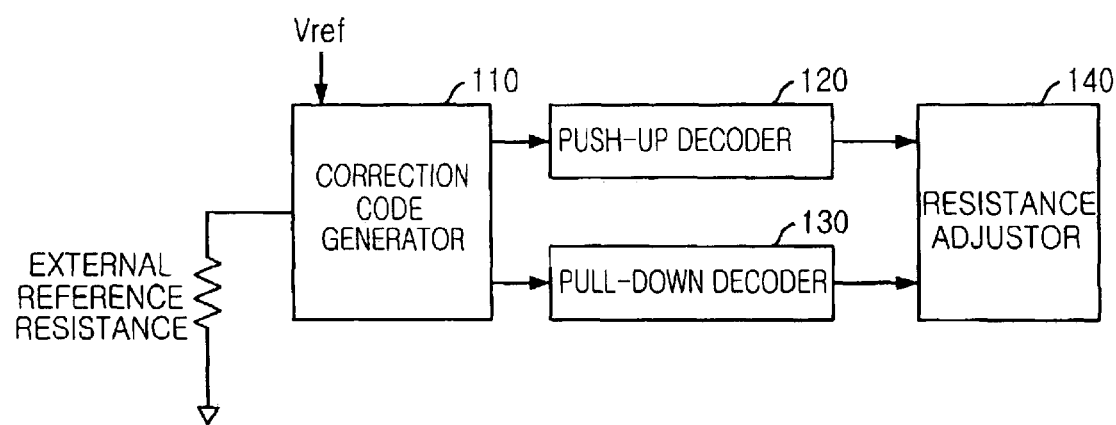
FIG. 1 is a block diagram illustrating a resistance calibration circuit according to an embodiment of the present invention.

Referring to FIG. 1, the resistance calibration circuit according to one embodiment of the present invention includes a correction code generator 110, a push-up decoder 120, a pull-down decoder 130 and a resistance adjustor 140. The correction code generator 110, which is connected to an external reference resistor, receives a reference voltage Vref and produces a plurality of push-up code signals and pull-down code signals based on an external reference resistor. The push-up code signals and pull-down code signals are respectively outputted to the push-up decoder 120 and a pull-down decoder 130 by the correction code generator 110. The push-up decoder 120 decodes a plurality of push-up code signals inputted from the correction code generator 110 and outputs the decoded signals, as push-up signals, to the resistance adjustor 140. The pull-down decoder 130 decodes a plurality of pull-down code signals inputted from correction code generator 110 and outputs the decoded signals, as pull-down signals, to the resistance adjustor 140. The resistance adjustor 140 receives the push-up signals from the push-up decoder 120 and the pull-down signals from the pull-down decoder 130 and then corrects the resistance in the output terminal by turning on/off a plurality of transistors in response to the push-up signals and the pull-down signals.

Figure 2:
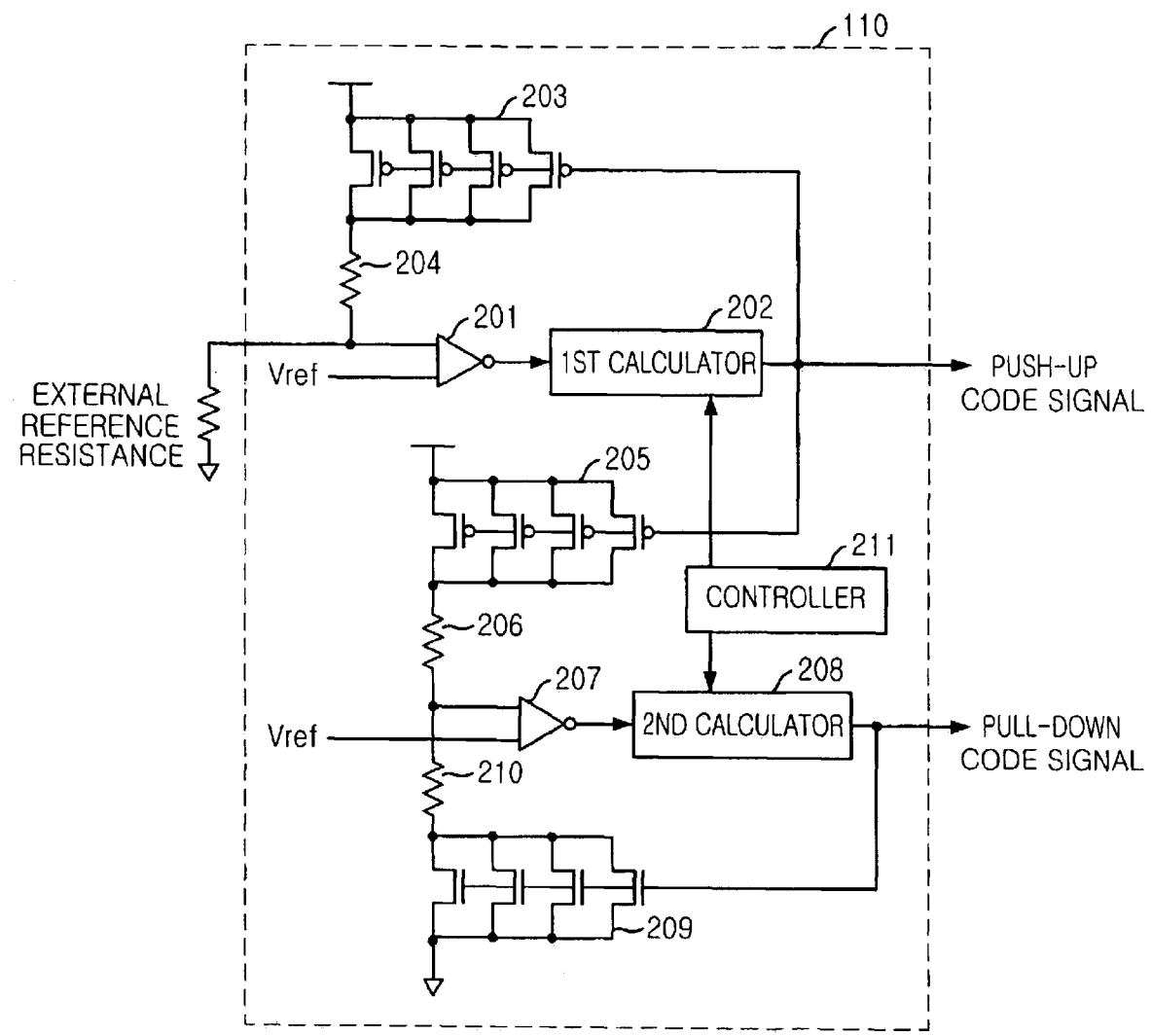
FIG. 2 is a block diagram illustrating a correction code generator in the resistance calibration circuit according to an embodiment of the present invention.

FIG. 2 is a block diagram illustrating the correction code generator 110 in the resistance calibration circuit according to the present invention.

A first OP amplifier 201 compares a voltage applied to the external reference resistor (connected to an first input terminal) with the reference voltage Vref applied to a second input terminal. If the voltage applied to the first input terminal is higher than the reference voltage Vref, a logic level of "1" is outputted to a first calculator 202 and, if the voltage applied to the first input terminal is lower than the reference voltage Vref, a logic level of "0" is outputted to a first calculator 202.

The first calculator 202 produces the push-up code signals in response to an output signal from the first OP amplifier 201 and outputs the push-up code signals to the push-up decoder 120. A first PMOS transistor group 203 has a plurality of PMOS transistors, each of which has a gate to receive the push-up code signals and a source connected to a power supplier. A first resistor 204 has a first terminal connected to drains of the first PMOS transistor group 203 and a second terminal connected to the first input terminal of the first OP amplifier 201.

On the other hand, a second PMOS transistor group 205 has a plurality of PMOS transistors, each of which has a gate to receive the push-up code signals and a source connected to the power supplier. A second resistor 206 has a first terminal connected to drains of the second PMOS transistor group 205 and a second terminal connected to a first input terminal of a second OP amplifier 207 (this second OP amplifier 207 will be described in detail below). The second OP amplifier 207 compares a voltage applied to the first input terminal with the reference voltage Vref applied to a second input terminal. If the voltage applied to the first input terminal is higher than the reference voltage Vref, a logic level of "1" is outputted to a second calculator 208 and, if the voltage applied to the first input terminal is lower than the reference voltage Vref, a logic level of "0" is outputted to the second calculator 208. The second calculator 208 produces the pull-down code signals in response to an output signal from the second OP amplifier 207 and outputs the pull-down code signals to the pull-down decoder 130. A first NMOS transistor group 209 has a plurality of NMOS transistors, each of which has a gate to receive the pull-down code signals and a source connected to a ground voltage level. A third resistor 210 has a first terminal connected to drains of the first NMOS transistor group 209 and a second terminal connected to a first input terminal of the second OP amplifier 207.

A controller 211 controls the first and second OP amplifiers 202 and 207.

Figure 3:
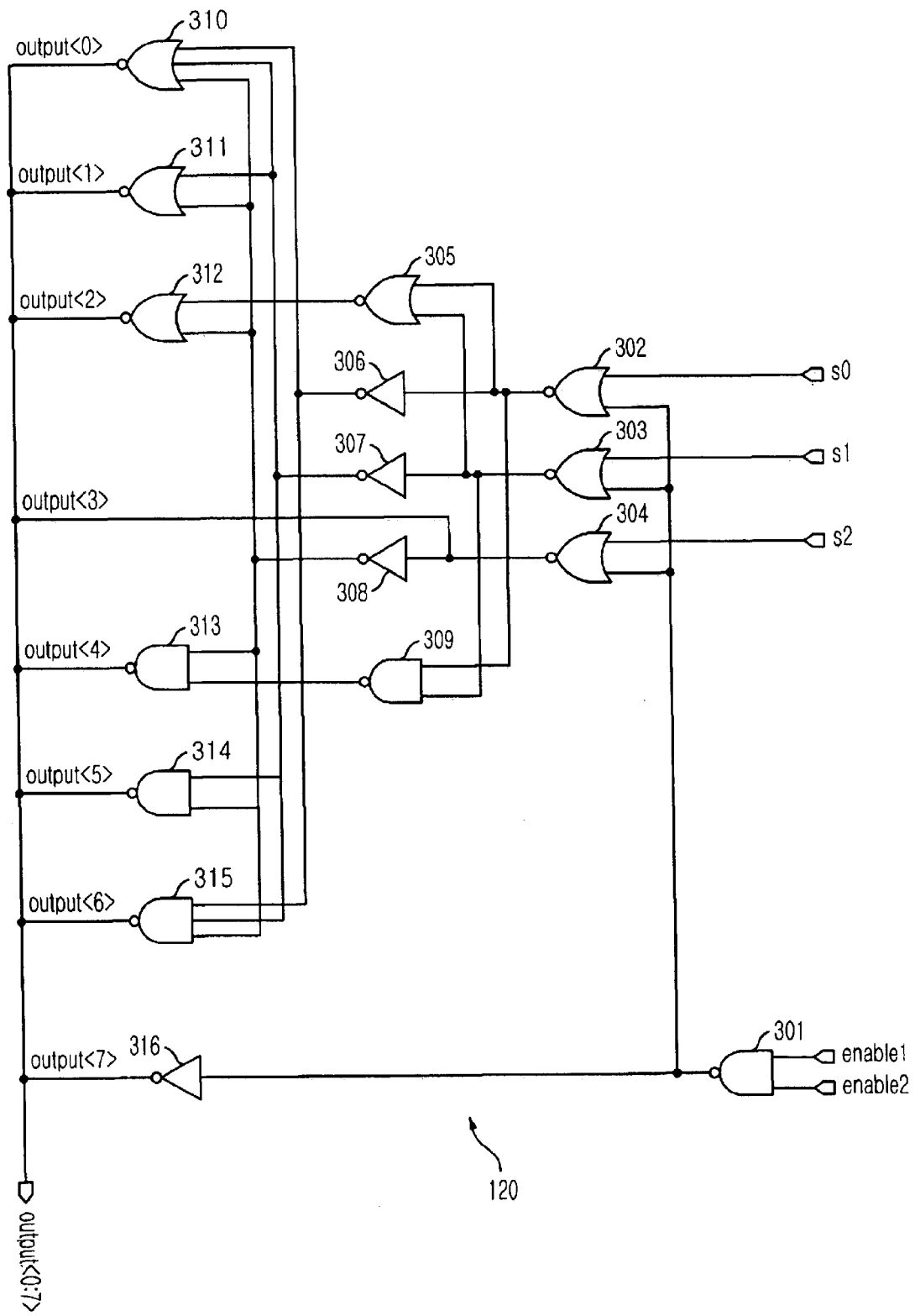
FIG. 3 is a block diagram illustrating a push-up decoder in the resistance calibration circuit according to an embodiment of the present invention.

FIG. 3 is a block diagram illustrating the push-up decoder 120 in the resistance calibration circuit according to an embodiment of the present invention. Referring to FIG. 3, a first NAND gate 301 receives first and second enable signals enable1 and enable2 to perform a NAND operation and outputs a logic value as a result of the NAND operation. A first NOR gate 302 receives the first push-up code signal and an output signal from the first NAND gate 301 to perform a NOR operation and outputs a logic value as a result of the NOR operation. A second NOR gate 303 receives the second push-up code signal and the output signal from the first NAND gate 301 to perform a NOR operation and outputs a logic value as a result of the NOR operation. A third NOR gate 304 receives the third push-up code signal and the output signal from the first NAND gate 301 to perform a NOR operation and outputs a logic value as a result of the NOR operation.

A fourth NOR gate 305 receives output signals from the first and second NOR gates 302 and 303 to perform a NOR operation and outputs a logic value as a result of the NOR operation. A first inverter 306 inverts an output signal from the first NOR gate 302, a second inverter 307 inverts an output signal from the second NOR gate 303, and a third inverter 308 inverts an output signal from the third NOR gate 304. A second NAND gate 309 receives output signals from the first and second NOR gates 302 and 303 to perform a NAND operation and outputs a logic value as a result of the NAND operation.

A fifth NOR gate 310 receives output signals from the first to third inverters 306 to 308 to perform a NOR operation and outputs a first bit of the push-up signal as a result of the NOR operation. A sixth NOR gate 311 receives output signals from the second and third inverters 307 and 308 to perform a NOR operation and outputs a second bit of the push-up signal as a result of the NOR operation. A seventh NOR gate 312 receives output signals from the fourth NOR gate 305 and the third inverter 308 to perform a NOR operation and outputs a third bit of the push-up signal as a result of the NOR operation. A third NAND gate 313 receives output signals from the second NAND gate 309 and the third inverter 308 to perform a NAND operation and outputs a fifth bit of the push-up signal as a result of the NAND operation. A fourth NAND gate 314 receives output signals from the second and third inverters 307 and 308 to perform a NAND operation and outputs a sixth bit of the push-up signal as a result of the NAND operation. A fifth NAND gate 315 receives output signals from the first to third inverters 306 to 308 to perform a NAND operation and outputs a seventh bit of the push-up signal as a result of the NAND operation.

On the other hand, a fourth inverter 316 inverts an output signal from the first NAND gate 301 and outputs an eighth bit of the push-up signal and a fourth bit of the push-up signal is directly produced by the third NOR gate 304.

Figure 4:
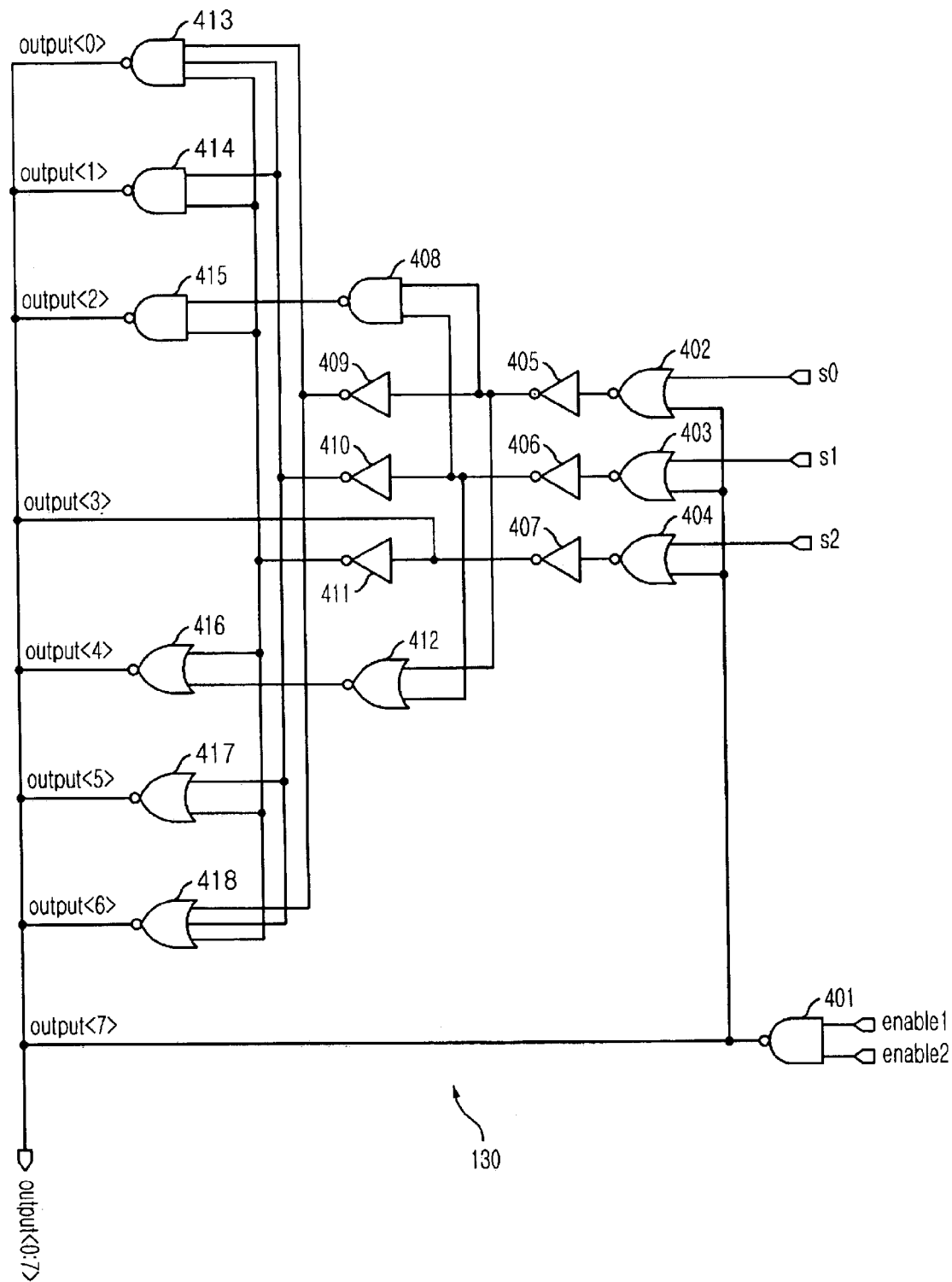
FIG. 4 is a block diagram illustrating a pull-down decoder in the resistance calibration circuit according to an embodiment of the present invention.

FIG. 4 is a block diagram illustrating the pull-down decoder 130 in the resistance calibration circuit according to the present invention. Referring to FIG. 4, a sixth NAND gate 401 receives first and second enable signals enable1 and enable2 to perform a NAND operation and outputs an eighth bit of the pull-down signal as a result of the NAND operation. An eighth NOR gate 402 receives the first pull-down code signal and the output signal from the sixth NAND gate 401 to perform a NOR operation and outputs a logic value as a result of the NOR operation. A ninth second NOR gate 403 receives the second pull-down code signal and an output signal from the sixth NAND gate 401 to perform a NOR operation and outputs a logic value as a result of the NOR operation. A tenth NOR gate 404 receives the third pull-down code signal and the output signal from the sixth NAND gate 401 to perform a NOR operation and outputs a fourth bit of the pull-down signal as a result of the NOR operation.

A fifth inverter 405 inverts an output signal from the eighth NOR gate 402, a sixth inverter 406 inverts an output signal from the ninth NOR gate 403, and a seventh inverter 407 inverts an output signal from the tenth NOR gate 404.

A seventh NAND gate 408 receives output signals from the fifth and sixth inverters 405 and 406 to perform a NAND operation and outputs a logic value as a result of the NAND operation. An eighth inverter 409 inverts an output signal from the fifth inverter 405, a ninth inverter 410 inverts an output signal from the sixth inverter 406, and a tenth inverter 410 inverts an output signal from the seventh inverter 407. An eleventh NOR gate 412 receives output signals from the fifth and sixth inverters 405 and 406 to perform a NOR operation and outputs a logic value as a result of the NOR operation.

An eight NAND gate 413 receives output signals from the eighth to tenth inverters 409 to 411 to perform a NAND operation and outputs a first bit of the pull-down signal as a result of the NAND operation. A ninth NAND gate 414 receives output signals from the ninth and tenth inverters 410 and 411 to perform a NAND operation and outputs a second bit of the pull-down signal as a result of the NAND operation. A tenth NAND gate 415 receives output signals from the seventh NAND gate 408 and the tenth inverter 411 to perform a NAND operation and outputs a third bit of the pull-down signal as a result of the NAND operation.

A twelfth NOR gate 416 receives output signals from the eleventh NOR gate 412 and the tenth inverter 411 to perform a NOR operation and outputs a fifth bit of the pull-down signal as a result of the NOR operation. A thirteenth NOR gate 417 receives output signals from the ninth and tenth inverters 410 and 411 to perform a NOR operation and outputs a sixth bit of the pull-down signal as a result of the NOR operation. A fourteenth NOR gate 418 receives output signals from the eighth to tenth inverters 409 to 411 to perform a NOR operation and outputs a seventh bit of the pull-down signal as a result of the NOR operation.

On the other hand, a fourth bit of the pull-down signal is directly produced by the seventh inverter 407.

Figure 5:
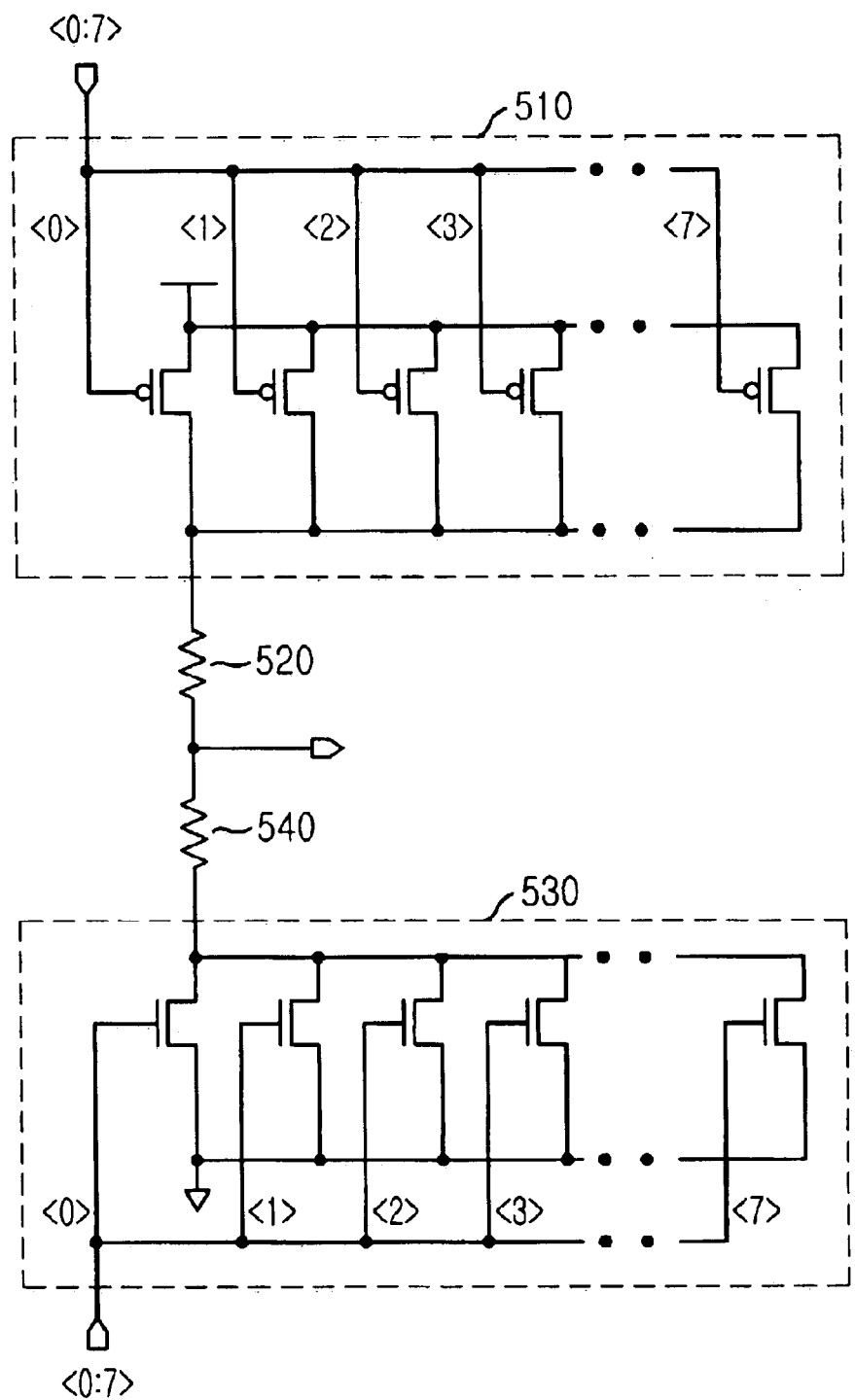
FIG. 5 is a block diagram illustrating a resistance adjustor in the resistance calibration circuit according to an embodiment of the present invention.

FIG. 5 is a block diagram illustrating the resistance adjustor 140 in the resistance calibration circuit according to an embodiment of the present invention.

A third PMOS transistor group 510 has a plurality of PMOS transistors, each of which has a gate to receive the bit signal of the push-up signal, a source connected to a power supplier and a drain connected to a fourth resistor 520. That is, the PMOS transistors are connected in parallel to each other and then turned on/off in response to the bit signal of the push-up signal. Accordingly, the resistance of the third PMOS transistor group 510 is controlled by the number of the turned-on PMOS transistors.

The fourth resistor 520 has a resistance value between drains of the third PMOS transistor group 510 and the I/O (input/output) terminal thereof. Also, since the third PMOS transistor group 510 is in series connected to the fourth resistor 520, the total resistance between the input and output terminals of the resistance adjustor 140 is caused by both the third PMOS transistor group 510 and the fourth resistor 520.

A second NMOS transistor group 530 has a plurality of NMOS transistors, each of which has a gate to receive the bit signal of the push-up signal, a source connected to a power supplier and a drain connected to a fifth resistor 540. That is, the NMOS transistors are connected in parallel to each other and then turned on/off in response to the bit signal of the push-up signal. Accordingly, the resistance of the third NMOS transistor group 530 is controlled by the number of the turned-on NMOS transistors.

Therefore, the fifth resistor 540 has a resistance value between drains of the second NMOS transistor group 530 and the I/O terminal thereof. Also, since the second NMOS transistor group 530 is in series connected to the fifth resistor 540, the total resistance between the input and output terminals of the resistance adjustor 140 is caused by both the second NMOS transistor group 530 and the fifth resistor 540.

Referring again to FIG. 1, the first OP amplifier 201 compares a voltage applied to the external reference resistor (connected to an first input terminal) with the reference voltage Vref applied to the second input terminal and outputs a logic level of "1" to the first calculator 202 when the voltage applied to the first input terminal is higher than the reference voltage Vref and also outputs a logic level of "0" to the first calculator 202 when the voltage applied to the first input terminal is lower than the reference voltage Vref.

The first calculator 202 counts a signal from the first OP amplifier 201, produces push-up code signal using the counted value, and then outputs the push-up code signal to both the push-up decoder 120 and the gates of the second PMOS transistor group 205. Similarly, the pull-down signal is produced by the second calculator 208 and the first NMOS transistor group 209. As a result, the pull-down resistance is dependent upon the push-up resistance. The push-up decoder 120 and the pull-down decoder 130 respectively decode the push-up code signal and the pull-down code signal as an 8-bit signal and the number of the turned-on PMOS and NMOS transistors are determined by the decoded push-up and pull-down code signals.

As apparent from the above, the present invention calibrates a termination resistance, which is distorted by transistors' resistance and a contact resistance, thereby to make the termination resistance have the same as an external resistance.

While the present invention has been described with respect to the particular embodiments, it will be apparent to those skilled in the art that various changes and modifications may be made without departing from the spirit and scope of the invention as defined in the following claims.

What is claimed is:

1. A resistance calibration circuit for use in a semiconductor device comprising:

a correction code generating means for generating a plurality of push-up code signals based on a comparison result between a voltage applied to an external reference resistor and a reference voltage and for generating a plurality of pull-down code signals based on the plurality of push-up code signals and the reference voltage;

a push-up decoder for decoding the plurality of push-up code signals to thereby generate a plural-bit push-up signal;

a pull-down decoder for decoding the plurality of pull-down code signals to thereby generate a plural-bit pull-down signal; and a resistance adjustor for selectively turning on/off a plurality of inner transistors included in the resistance adjustor according to the plural-bit push-up signal and the plural-bit pull-down signal.

2. The resistance calibration circuit in accordance with claim 1, wherein the correction code generating means includes:

a first OP amplifier for comparing the voltage applied to the external reference resistor with the reference voltage in order to output a first logic level if the voltage applied to the external reference resistor is higher than the reference voltage and output a second logic level if the voltage applied to the external reference resistor is lower than the reference voltage;

a first calculating means for generating the plurality of push-up code signals according to an output of the first OP amplifier;

a first p-type metal oxide semiconductor (PMOS) transistor group having a plurality of PMOS transistors, each of which has a gate to receive one of the push-up code signals and a source connected to a power supplier;

a first resistor connected between drains of the first PMOS transistor group and a first input terminal of the first OP amplifier;

a second PMOS transistor group having a plurality of PMOS transistors, each of which has a gate to receive one of the push-up code signals and a source connected to the power supplier;

a second resistor connected to drains of the second PMOS transistor group;

a second OP amplifier of which first input terminal is connected to the second resistor, wherein the second OP amplifier compares a voltage applied to the first input terminal with the reference voltage in order to output the first logic level if the voltage applied to the first input terminal is higher than the reference voltage and output the second logic level if the voltage applied to the first input terminal is lower than the reference voltage;

a second calculating means for generating the plurality of pull-down code signals according to an output of the second OP amplifier;

a first n-type metal oxide semiconductor (NMOS) transistor group having a plurality of NMOS transistors, each of which has a gate to receive one of the pull-down code signals and a source connected to a ground voltage;

a third resistor connected between drains of the first NMOS transistor group and the first input terminal of the second OP amplifier; and a controller coupled to the first and the second calculating means for controlling the first and the second calculating means.

3. The resistance calibration circuit in accordance with claim 2, wherein the push-up decoder includes:

a first NAND gate for performing a logic NAND operation on first and second enable signals;

a first NOR gate for performing a logic NOR operation on a first push-up code signal and an output of the first NAND gate;

a second NOR gate for performing a logic NOR operation on a second push-up code signal and the output of the first NAND gate;

a third NOR gate for performing a logic NOR operation on a third push-up code signal and the output of the first NAND gate to thereby output a fourth bit of the plural-bit push-up signal;

a fourth NOR gate for performing a logic NOR operation on an output of the first NOR gate and an output of the second NOR gate;

a first inverter for inverting the output of the first NOR gate;

a second inverter for inverting the output of the second NOR gate;

a third inverter for inverting an output of the third NOR gate;

a second NAND gate for performing a logic NAND operation on the output of the first NOR gate and the output of the second NOR gate;

a fifth NOR gate for performing a logic NOR operation on output signals of the first to the third inverters to thereby output a first bit of the plural-bit push-up signal;

a sixth NOR gate for performing a logic NOR operation on output signals of the second and the third inverters to thereby output a second bit of the plural-bit push-up signal;

a seventh NOR gate for performing a logic NOR operation on an output of the fourth NOR gate and the output of the third inverter to thereby output a third bit of the plural-bit push-up signal;

a third NAND gate for performing a logic NAND operation on an output of the second NAND gate and the output of the third inverter to thereby output a fifth bit of the plural-bit push-up signal;

a fourth NAND gate for performing a logic NAND operation on the output of the second inverter and the output of the third inverter to thereby output a sixth bit of the plural-bit push-up signal;

a fifth NAND gate for performing a logic NOR operation on output signals of the first to the third inverters to thereby output a seventh bit of the plural-bit push-up signal; and a fourth inverter for inverting the output of the first NAND gate to thereby output an eighth bit of the plural-bit push-up signal.

4. The resistance calibration circuit in accordance with claim 3, wherein the pull-down decoder includes:

a sixth NAND gate for performing a logic NAND operation on the first and the second enable signals to thereby output an eighth bit of the plural-bit pull-down code signal;

an eight NOR gate for performing a logic NOR operation on a first pull-down code signal and an output of the sixth NAND gate;

a ninth NOR gate for performing a logic NOR operation on a second pull-down code signal and the output of the sixth NAND gate;

a tenth NOR gate for performing a logic NOR operation on a third push-up code signal and the output of the sixth NAND gate;

a fifth inverter for inverting an output of the eight NOR gate;

a sixth inverter for inverting an output of the ninth NOR gate;

a seventh inverter for inverting an output of the tenth NOR gate to thereby output a fourth bit of the plural-bit pull-down signal;

a seventh NAND gate for performing a logic NAND operation on an output of the fifth inverter and an output of the sixth inverter;

an eight inverter for inverting the output of the fifth inverter;

a ninth inverter for inverting the output of the sixth inverter;

a tenth inverter for inverting an output of the seventh inverter;

an eleventh NOR gate for performing a logic NOR operation on the output of the fifth inverter and the output of the sixth inverter;

an eight NAND gate for performing a logic NAND operation on output signals of the eight to the tenth inverters to thereby output a first bit of the plural-bit pull-down signal;

a ninth NAND gate for performing a logic NAND operation on the output of the ninth inverter and the output of the tenth inverter to thereby output a second bit of the plural-bit pull-down signal;

a tenth NAND gate for performing a logic NAND operation on an output of the seventh NAND gate and the output of the tenth inverter to thereby output a third bit of the plural-bit pull-down down signal;

a twelfth NOR gate for performing a logic NOR operation on an output of the eleventh NOR gate and the output of the tenth inverter to thereby output a fifth bit of the plural-bit pull-down signal;

a thirteenth NOR gate for performing a logic NOR operation on the output of the ninth inverter and the output of the tenth inverter to thereby output a sixth bit of the plural-bit pull-down signal; and a fourteenth NOR gate for performing a logic NOR operation on the output signals of the eighth to the tenth inverters to thereby output a seventh bit of the plural-bit pull-down signal.

5. The resistance calibration circuit in accordance with claim 4, wherein the resistance adjustor includes:

a third PMOS transistor group having a plurality of PMOS transistors, each of which has a gate coupled to one bit of the plural-bit push-up signal and a source connected to the power supplier;

a fourth resistor connected to drains of the third PMOS transistor group and an I/O terminal thereof;

a second NMOS transistor group having a plurality of NMOS transistors, each of which has a gate coupled to one bit of the plural-bit pull-down signal and a source connected to a ground voltage level; and a fifth resistor connected to drains of the second NMOS transistor group and the I/O terminal thereof.

6. A resistance calibration circuit in a semiconductor device, wherein the resistance calibration circuit is coupled to an I/O terminal of the semiconductor device, the resistance calibration circuit comprising;

a first resistor connected to the I/O terminal;

a second resistor connected to the I/O terminal;

a plurality of push-up transistors connected to the first resistor and controlled by a push-up signal, wherein the push-up transistors are in parallel connected to each other;

a plurality of pull-down transistors connected to the second resistor and controlled by a pull-down signal, wherein the pull-down transistors are in parallel connected to each other; and a control signal generator for producing the push-up signal and the pull-down signal based on a voltage variation of a voltage difference between a reference voltage and an external voltage, wherein the external voltage is applied to a fixed resistor.

7. The resistance calibration circuit in accordance with claim 6, wherein the control signal generator includes:

a correction code generating means for generating a plurality of push-up code signals and a plurality of pull-down code signals based on an external reference resistor, wherein a reference voltage is applied to the correction code generating means;

a push-up decoder for decoding the plurality of push-up code signals from the correction code generating means;

a pull-down decoder for decoding the plurality of pull-down code signals from the correction code generating means; and a resistance adjustor for receiving a push-up signal from the push-up decoder and a pull-down signal from the pull-down decoder and for turning on/off a plurality of inner transistors.

* * * * *